United States Patent
Xu et al.

(10) Patent No.: US 7,947,363 B2
(45) Date of Patent: *May 24, 2011

(54) COATED ARTICLE WITH NANOLAYERED COATING SCHEME

(75) Inventors: Fengting Xu, New Haven, CT (US);
Wangyang Ni, Latrobe, PA (US);
Ronald M. Penich, Greensburg, PA (US); Yixiong Liu, Greensburg, PA (US); Volker-Hermann Derflinger, Feldkirch (AT); Dennis T. Quinto, Wheatfield, NY (US); Charles E. Bauer, Pittsburgh, PA (US); Qian Ding, Crystal Lake, IL (US)

(73) Assignees: Kennametal Inc., Latrobe, PA (US);
Oerlikon Trading Ltd., Truebbach (CH)

(*) Notice: Subject to any disclaimer, the term of this patent is extended or adjusted under 35 U.S.C. 154(b) by 615 days.

This patent is subject to a terminal disclaimer.

(21) Appl. No.: 12/002,009

(22) Filed: Dec. 14, 2007

(65) Prior Publication Data
US 2009/0155559 A1 Jun. 18, 2009

(51) Int. Cl.
*B32B 9/00* (2006.01)
(52) U.S. Cl. .......... 428/298; 51/307; 51/309; 428/216; 428/336; 428/472; 428/697; 428/699; 428/701; 428/702; 427/419.1; 427/419.2; 427/419.7
(58) Field of Classification Search .......... 51/307, 51/309; 428/216, 336, 472, 697, 698, 699, 428/701, 704; 427/419.1, 419.2, 419.7
See application file for complete search history.

(56) References Cited

U.S. PATENT DOCUMENTS

| | | | | |
|---|---|---|---|---|
| 4,436,830 A | * | 3/1984 | Andreev et al. | 501/96.1 |
| 6,077,596 A | * | 6/2000 | Hashimoto et al. | 428/336 |
| 6,103,357 A | | 8/2000 | Selinder et al. | |
| 6,250,855 B1 | * | 6/2001 | Persson et al. | 51/309 |

(Continued)

FOREIGN PATENT DOCUMENTS

EP 872575 * 10/1998

(Continued)

OTHER PUBLICATIONS

International Search report for International Application No. PCT/US2008/084838 filed Nov. 26, 2008 (3 pages) mailed Jul. 16, 2009.

(Continued)

*Primary Examiner* — Archene Turner
(74) *Attorney, Agent, or Firm* — Matthew W. Gordon

(57) ABSTRACT

A coated article that includes a substrate and a wear-resistant coating scheme. The coated article may be a cutting insert shown to improve performance in chip-forming material removal operations or a wear-resistant component used in chipless forming operations. The wear-resistant coating scheme has an underlayer and top layer containing aluminum, chromium, and nitrogen. The coating scheme also includes a mediate multi-periodicity nanolayer coating scheme containing titanium, aluminum, chromium and nitrogen. The mediate multi-periodicity nanolayer coating scheme includes a plurality of sets of alternating layer arrangements. Each one of the alternating layer arrangements has a base layer comprising titanium, aluminum and nitrogen and a nanolayer region having a plurality of sets of alternating nanolayers. Each set of alternating nanolayers has one nanolayer having aluminum, chromium, titanium and nitrogen and another nanolayer having aluminum, chromium, titanium and nitrogen. The base layer has a base layer thickness and the nanolayer region has a nanolayer region thickness. The base layer thickness is smaller than the nanolayer region thickness.

22 Claims, 7 Drawing Sheets

U.S. PATENT DOCUMENTS

| | | | |
|---|---|---|---|
| 6,309,738 B1 * | 10/2001 | Sakurai | 428/698 |
| 6,730,392 B2 | 5/2004 | Vetter et al. | |
| 6,794,064 B2 * | 9/2004 | Vetter | 428/699 |
| 6,824,601 B2 | 11/2004 | Yamamoto et al. | |
| 6,919,288 B2 | 7/2005 | Yamamoto et al. | |
| 7,008,688 B2 | 3/2006 | Toihara | |
| 7,025,863 B2 | 4/2006 | Seeli et al. | |
| 7,056,602 B2 | 6/2006 | Horling et al. | |
| 7,083,868 B2 | 8/2006 | Horling et al. | |
| 7,186,324 B2 | 3/2007 | Yamamoto et al. | |
| 7,226,670 B2 | 6/2007 | Derflinger et al. | |
| 7,504,149 B2 * | 3/2009 | Toihara et al. | 428/699 |
| 7,537,822 B2 * | 5/2009 | Ishikawa | 428/697 |
| 7,541,101 B2 * | 6/2009 | Weber | 51/307 |
| 7,727,621 B2 * | 6/2010 | Nordlof et al. | 428/216 |
| 2005/0170162 A1 | 8/2005 | Yamamoto et al. | |
| 2006/0269788 A1 | 11/2006 | Ishikawa | |

FOREIGN PATENT DOCUMENTS

| | | | |
|---|---|---|---|
| EP | 1 174 528 A2 | | 1/2002 |
| EP | 1 186 681 A1 | | 3/2002 |
| EP | 0 983 393 B1 | | 11/2003 |
| EP | 1705263 A1 | | 9/2006 |
| EP | 1717347 A2 | | 11/2006 |
| EP | 1793014 A1 | | 6/2007 |
| EP | 1795628 A1 | | 6/2007 |
| JP | 09-300105 | * | 11/1997 |
| JP | 11-131215 | * | 5/1999 |
| JP | 2000-038653 | * | 2/2000 |
| JP | 2001-254187 | * | 9/2001 |
| JP | 2003-340608 | | 2/2003 |
| JP | 2004-050381 A2 | | 2/2004 |
| JP | 2004-106108 | | 8/2004 |
| WO | WO 2006/041366 A1 | | 4/2006 |
| WO | WO 2006/070730 A1 | | 7/2006 |
| WO | WO 2006/084404 A1 | | 8/2006 |
| WO | PCT/JP2005/023761 | | 11/2006 |

OTHER PUBLICATIONS

Written Opinion for International Application No. PCT/US2008/084838 filed Nov. 26, 2008 (4 pages) mailed Jul. 16, 2009.

* cited by examiner

COATED ARTICLE WITH NANOLAYERED COATING SCHEME

BACKGROUND OF THE INVENTION

The invention pertains to a coated article, as well as a method for applying the coating scheme. More specifically, the invention pertains to a coated article wherein the coating scheme includes nanolayers containing aluminum, chromium, titanium and nitrogen, as well as a method for applying the coating scheme. Exemplary coated articles include without limitation cutting inserts and wear components.

Referring to a coated cutting insert as one example of a coated article, a coated cutting insert typically comprises a substrate with a coating scheme thereon. The cutting insert exhibits a geometry such that it typically has rake surfaces and flank surfaces wherein there are cutting edges at the intersection (or juncture) of the rake surfaces and the flank surfaces. For coated cutting inserts in general, any one of a number of different techniques can apply the coating scheme to the substrate. These techniques can include chemical vapor deposition (CVD) and physical vapor deposition (PVD).

Coated cutting inserts are useful for the removal of material in a chipforming material removal operation. Chipforming material removal operations include, without limitation, milling, turning, boring, drilling and like operations wherein a cutting insert engages a workpiece with the cutting insert and workpiece moving relative to each other. A great amount of heat can exist at the point (or surface) of engagement between the workpiece and cutting insert (i.e., cutting insert-chip interface). Transfer of the heat at the cutting-chip interface into the substrate and the interface between the coating scheme and the substrate (i.e., coating-substrate interface) can be detrimental to cutting insert performance. More specifically, transfer of heat to the substrate and the coating-substrate interface creates premature excessive wear of the coating. Such excessive wear of the coating scheme typically shortens the useful life of the coated cutting insert.

The coating scheme typically influences the extent of heat transfer from the cutting insert-chip interface to the substrate and coating-substrate interface. The thermal conductivity of the coating scheme is a property that can strongly influence the extent of such heat transfer. A coating scheme that exhibits an overall lower thermal conductivity typically reduces the amount of heat in the substrate and at the coating-substrate interface. Such a reduction in heat transfer typically results in a longer useful tool life for the cutting insert in comparison to a coated cutting insert that does not exhibit a reduction in heat transfer.

In the past, coated cutting inserts have exhibited various coating schemes. For example, U.S. Patent Application Publication No. US 2006/0269788 A1 to Ishikawa appears to disclose alternating layers of AlCrTiN with differing compositions between the layers. According to the English abstracts, Japanese Patent Publication No. 2003 340608 A2 to Natsuki et al. and Japanese Patent Publication No. 2004 106108 A2 to Hidemitsu et al. each provide a disclosure that appears to include alternating layers of TiAlCrN, but the chromium is always present in each coating layer.

WO 2006/084404 A1 to Endrino (assigned to Uniaxis Balzer AG) appears to disclose the use of an AlCrN inner coating layer and an AlCrN outer coating layer. According to the English abstract, Japanese Patent Publication No. 2004 050381 A2 to Yasuhiko apparently discloses a surface layer of AlCrN. U.S. Pat. No. 7,226,670 B2 to Derflinger et al. (assigned to OC Oerlikon Balzers AG) appears to teach that AlCrN is a beneficial coating material.

U.S. Patent Application Publication No. US 2005/0170162 A1 to Yamamoto et al. apparently discloses a coating layer of (Ti Al Cr)N in an alternating coating scheme. U.S. Pat. No. 6,730,392 B2 to Vetter et al. seems to disclose an alternating coating scheme wherein the layers have different contents of aluminum, titanium and chromium, as well as different nitrogen/oxygen ratios. U.S. Pat. No. 7,008,688 B2 to Toihara appears to show alternating coating layer arrangement using TiAlN and CrN. Further, the following patent documents seems to show various coating schemes with alternating coating layers: U.S. Pat. No. 6,103,357 to Selinder et al., U.S. Pat. No. 7,056,602 to Hörling et al., U.S. Pat. No. 7,083,868 to Hörling et al., and PCT Patent Publication WO 2006/041366 A1 to Astrand et al.

The following three patents apparently show the utility of (Ti Al Cr)N films: U.S. Pat. No. 6,824,601 B2 to Yamamoto et al., U.S. Pat. No. 6,919,288 B2 to Yamamoto et al., and U.S. Pat. No. 7,186,324 B2 to Yamamoto et al.

SUMMARY OF THE INVENTION

In one form thereof, the invention is a coated cutting insert for use in a chipforming material removal operation. The cutting insert comprises a substrate and a wear-resistant coating scheme. The wear-resistant coating scheme comprises a mediate multi-periodicity nanolayer coating scheme containing titanium, aluminum, chromium and nitrogen. The mediate multi-periodicity nanolayer coating scheme comprises a plurality of sets of alternating layer arrangements wherein each one of the alternating layer arrangements comprises a base layer comprising titanium, aluminum and nitrogen and a nanolayer region comprising a plurality of sets of alternating nanolayers. Each set of alternating nanolayers comprises one nanolayer comprising aluminum, chromium, titanium and nitrogen, and another nanolayer comprises aluminum, chromium, titanium and nitrogen. The base layer has a base layer thickness and the nanolayer region has a nanolayer region thickness wherein the base layer thickness is smaller than the nanolayer region thickness.

In yet another form thereof, the invention is a coated cutting insert for use in a chipforming material removal operation. The cutting insert comprises a substrate and a wear-resistant coating scheme. The wear-resistant coating scheme comprises a mediate multi-periodicity nanolayer coating scheme containing titanium, aluminum, chromium and X. The mediate multi-periodicity nanolayer coating scheme comprises a plurality of sets of alternating layer arrangements wherein each one of the alternating layer arrangements comprises a base layer comprising titanium, aluminum and X and a nanolayer region comprising a plurality of sets of alternating nanolayers. Each set of alternating nanolayers comprises one nanolayer comprising aluminum, chromium, titanium and X and another nanolayer comprising aluminum, chromium, titanium and X. X comprises any one of the following nitrogen, carbon, boron, carbon and nitrogen, boron and nitrogen, carbon and boron and nitrogen, nitrogen and oxygen, carbon and oxygen, boron and oxygen, carbon and nitrogen and oxygen, boron and nitrogen and oxygen, and carbon and boron and nitrogen and oxygen. The base layer has a base layer thickness and the nanolayer region has a nanolayer region thickness wherein the base layer thickness is smaller than the nanolayer region thickness.

In still another form thereof, a method of applying a coating scheme comprising the steps of: applying a mediate multi-periodicity nanolayer coating scheme containing titanium, aluminum, chromium and X, and the step of applying the mediate multi-periodicity nanolayer coating scheme comprising the steps of: applying a plurality of sets of alternating layer arrangements wherein application of each alternating layer arrangement comprising the steps of: applying a base layer comprising titanium, aluminum and X; and applying a nanolayer region comprising the steps of: applying a plurality of sets of alternating nanolayers comprising the steps of: applying one nanolayer comprising titanium, aluminum chromium, and X, and applying another nanolayer comprising aluminum, chromium, titanium and X.

In still another form thereof, the invention is a coated article. The coated article comprises a substrate and a wear-resistant coating scheme. The wear-resistant coating scheme comprises a mediate multi-periodicity nanolayer coating scheme containing titanium, aluminum, chromium and nitrogen. The mediate multi-periodicity nanolayer coating scheme comprises a plurality of sets of alternating layer arrangements wherein each one of the alternating layer arrangements comprises a base layer comprising titanium, aluminum and nitrogen and a nanolayer region comprising a plurality of sets of alternating nanolayers. Each set of alternating nanolayers comprises one nanolayer comprising aluminum, chromium, titanium and nitrogen, and another nanolayer comprises aluminum, chromium, titanium and nitrogen. The base layer has a base layer thickness and the nanolayer region has a nanolayer region thickness wherein the base layer thickness is smaller than the nanolayer region thickness.

BRIEF DESCRIPTION OF THE DRAWINGS

The following is a brief description of the drawings that form a part of this patent application.

DETAILED DESCRIPTION

Figure 1:
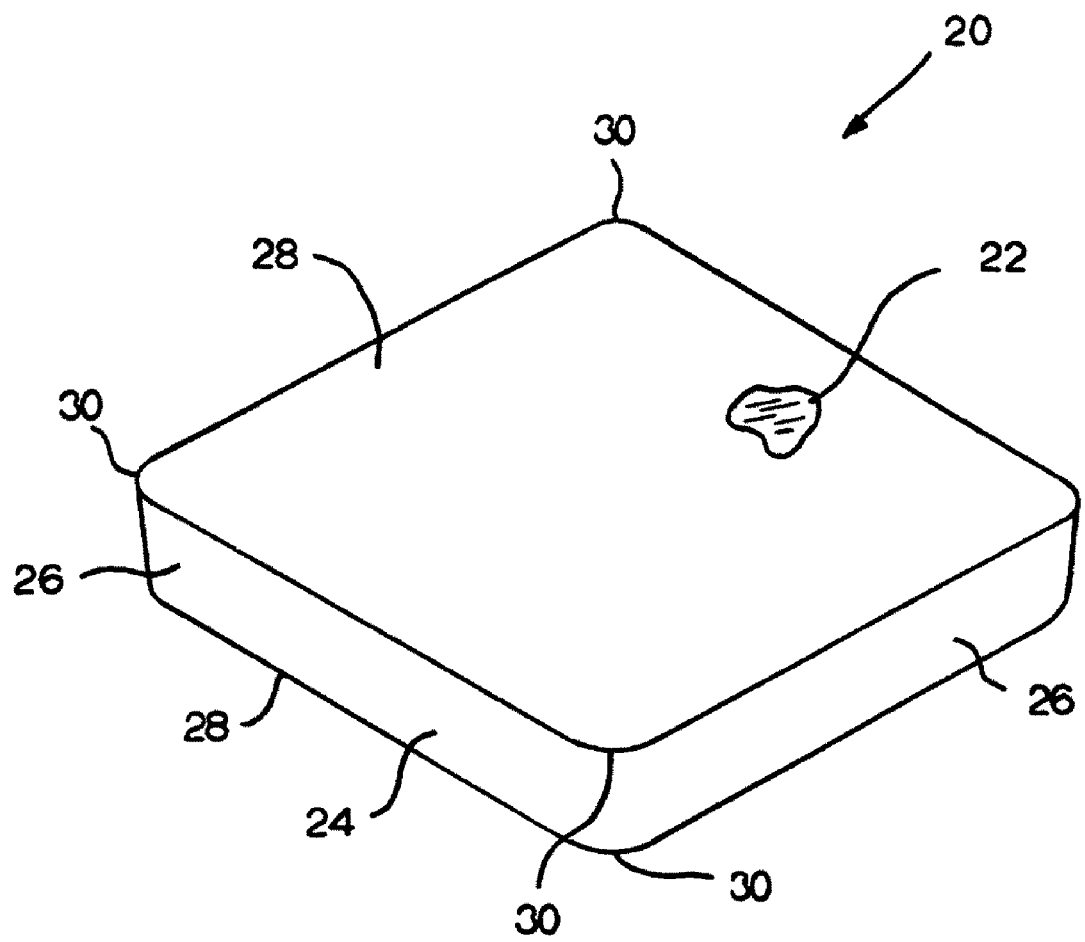
FIG. 1 is an isometric view of a coated cutting insert of the invention wherein the coated cutting insert comprises a substrate and a wear-resistant coating scheme and a portion of the coating has been removed to expose the substrate.

FIG. 1 is an isometric view of a coated cutting insert of the invention generally designated as 20. Coated cutting insert 20 comprises a substrate 22 and a coating scheme 24. A portion of the coating 24 has been removed to expose the substrate 22. The coating scheme 24 is on the surface of the cutting insert substrate 22. Coated cutting insert 20 exhibits flank surfaces 26 and rake surfaces 28. Cutting edges 30 exist at the intersections of the flank surfaces 26 and rake surfaces 28. Substrate 22 can be any one of a number of materials suitable as a substrate for use as a cutting insert including, but not limited to, the following materials: high speed steel, cemented carbides including cobalt-tungsten carbide, ceramics including SiAlON and alumina and silicon nitride, cermets including titanium carbide-based materials, and superhard materials including sintered cubic boron nitride and sintered diamond.

Coated cutting inserts, such as cutting insert 20, are useful for the removal of material in a chipforming material removal operation. Chipforming material removal operations include, without limitation, milling, turning, boring, drilling and like operations wherein a cutting insert engages a workpiece with the cutting insert and workpiece moving relative to each other. A great amount of heat can exist at the point (or surface) of engagement between the workpiece and cutting insert (i.e., cutting insert-chip interface). Transfer of the heat at the cutting insert-chip interface into the substrate and the interface between the coating scheme and the substrate (i.e., coating-substrate interface) can be detrimental to cutting insert performance. More specifically, transfer of heat to the substrate and the coating-substrate interface weakens the adhesion of the coating to the substrate, which creates premature excessive wear of the coating. Such excessive wear of the coating scheme typically shortens the useful life of the coated cutting insert.

The coating scheme typically influences the extent of heat transfer from the cutting insert-chip interface to the substrate and coating-substrate interface. Since the transfer of heat, and especially excessive heat, to the substrate and the coating-substrate interface is detrimental to the integrity of the coating, a coating scheme that exhibits overall thermal conductivity properties that reduce such heat transfer is advantageous. This is so because such a reduction in heat transfer typically results in a longer useful tool life for the cutting insert in comparison to a coated cutting insert that does not exhibit a reduction in heat transfer. In the present embodiments, by using selected coating sequences, the overall coating scheme exhibits overall thermal conductivity properties that minimize the extent of heat transfer from the cutting insert-chip interface (or contact zone chip-coating surface) to the substrate and coating-substrate interface.

The specific coating scheme has a multilayer structure which contains one or more coating layers that contain aluminum, chromium and nitrogen (e.g., aluminum chromium nitride), which has a lower thermal conductivity, and one or more layers that contain titanium, aluminum and nitrogen (e.g., titanium aluminum nitride), which has a higher thermal conductivity. Using these two coating layers, i.e., aluminum chromium nitride and titanium aluminum nitride, in a particular arrangement (or architecture) results in a reduction (or minimization) of the heat transfer from the cutting insert-chip interface down to the substrate and the coating-substrate interface.

More specifically, use of the aluminum chromium nitride top coating layer helps to impede the transfer of heat from the cutting insert-chip interface to the substrate and coating-substrate interface due to the lower thermal conductivity of the aluminum chromium nitride. As a result, some of the heat remains in the chip and does not pass into and through the coating and into the substrate and coating-substrate interface. Thus, while there is an appreciation that use of a top coating with a lower thermal conductivity provides advantages, use of such a layer by itself can be detrimental because excessive concentration of heat at the cutting edge, which results in tool failures at the cutting edge.

To overcome the presence of excessive heat at the cutting edge due to the top coating layer with a lower thermal conductivity, a coating scheme can have an underlying coating layer of titanium aluminum nitride, which has a higher thermal conductivity, underneath the aluminum chromium nitride layer. The underlying coating layer serves to dissipate the heat in the top coating layer so that heat will spread in all directions (e.g., in a direction perpendicular, as well as parallel to the surface) within the titanium aluminum nitride coating layer. Such heat dissipation (or spatial distribution of heat) removes the excessive concentration of heat at the cutting edge.

As the heat transfer proceeds sequentially from the top coating layer to the innermost coating layer, the coating layers in the multilayer-nanolayer coating sequence (or coating architecture) are such that the aluminum chromium nitride coating layers impede or block heat transfer and the titanium aluminum nitride coating layers dissipate or spread-away heat. The result of the coating functioning to alternatively block heat transfer or dissipate heat results in a reduction of heat in the substrate and at the coating-substrate interface. Further, the presence of another aluminum chromium nitride base coating layer, which has a lower thermal conductivity, between the substrate and the base layer helps to protect the substrate and the coating-substrate interface against the heat transfer. Reduction in heat transfer to the substrate and the coating-substrate interface results in a reduction (or minimization) or delay of thermal crack formation within the substrate. The delay or reduction of thermal cracking in the substrate typically increases the useful life of the cutting insert.

Figure 2:
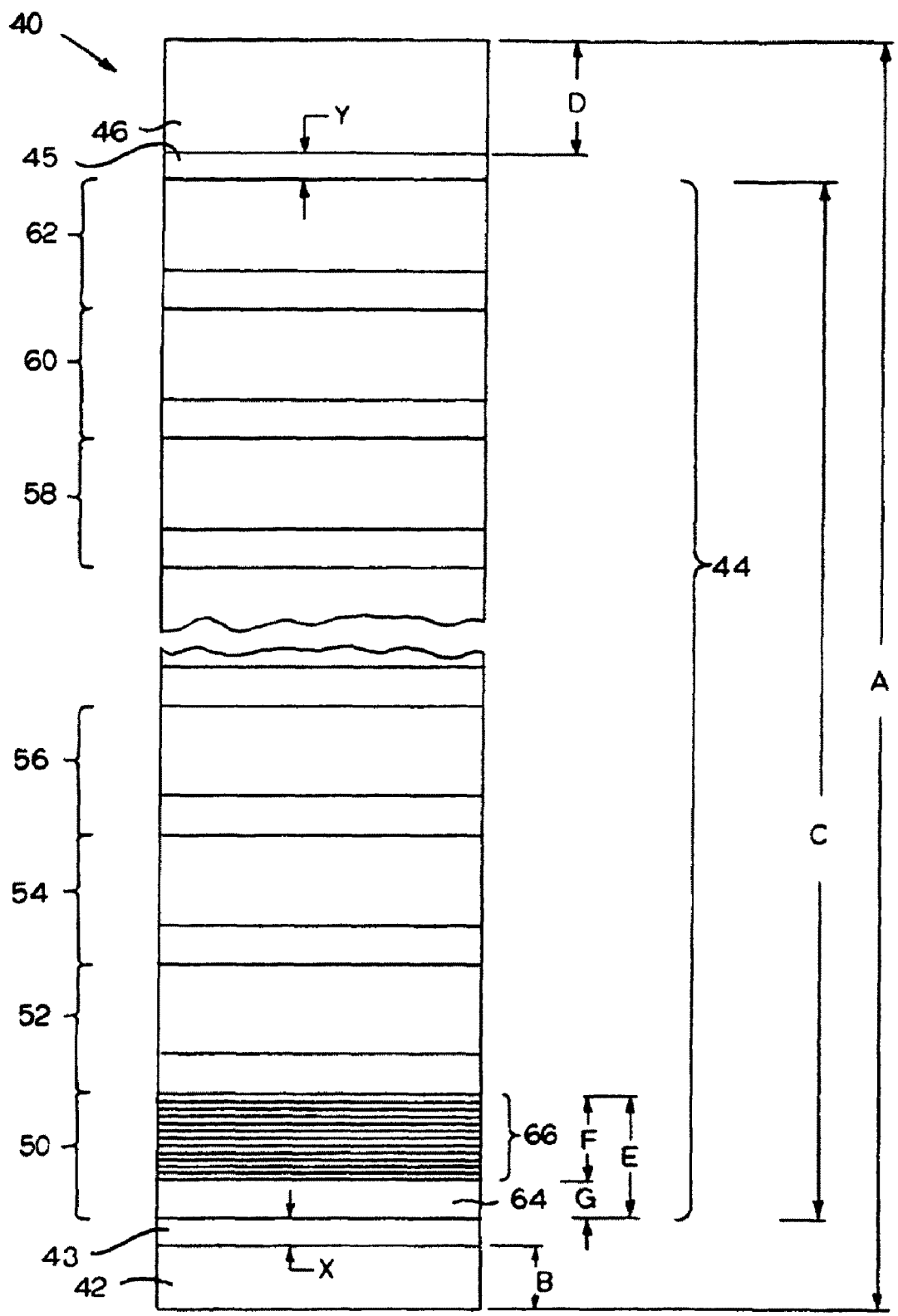
FIG. 2 is a schematic view of a specific embodiment of a wear-resistant coating scheme of the invention.

FIG. 2 illustrates in a cross-sectional form a specific embodiment of the wear-resistant coating scheme generally designated as 40 of the invention. Physical vapor deposition (PVD) is the technique used to apply coating scheme 40. The wear-resistant coating scheme 40 comprises an underlayer 42, which contains aluminum, chromium and nitrogen. The coating scheme 40 further contains a top layer 46, which contains aluminum, chromium and nitrogen. The underlayer 42 and the top layer 46 each exhibit a lower thermal conductivity as discussed above. The coating scheme 40 also contains a mediate multi-periodicity nanolayer coating scheme (see bracket 44), which contains titanium, aluminum, chromium and nitrogen. The wear-resistant coating scheme 40 has a coating thickness A equal to between about 1500 nanometers and about 15,000 nanometers. The different coating layers in the mediate multi-periodicity nanolayer coating scheme can be of different compositions that have different thermal conductivities. By selectively arranging the coating layers in the mediate multi-periodicity nanolayer coating scheme one achieves a coating architecture that functions to alternatively block heat transfer or dissipate heat, which results in a reduction of heat in the substrate and at the coating-substrate interface.

The coating scheme also includes a lower transition coating layer 43 that is on top of the underlayer 42. The lower transition coating layer 43 provides a transition between the underlayer 42 to the mediate multi-periodicity nanolayer coating scheme 44. There is an upper transition coating layer 45 that provides a transition between the mediate multi-periodicity nanolayer coating scheme 44 and the top layer 46.

In this specific embodiment, the underlayer 42 is closest to the substrate and the top layer 46 is farthest from the substrate. The mediate multi-periodicity nanolayer coating scheme 44 is mediate of the lower transition coating layer 43 and the upper transition coating layer 45. There should be an appreciation that other underlayers (or multiple coating layers) could be located between the underlayer 42 and the surface of the substrate. There should also be an appreciation that a top coating layer (or top coating layer scheme of multiple coating layers) could be on the top of the top layer 46.

The underlayer 42 exhibits an underlayer thickness B, which ranges between about 20 nanometers and about 500 nanometers. The top layer 46 exhibits a top layer thickness D, which ranges between about 300 nanometers and about 2000 nanometers. More preferably, the thickness of the top layer 46 is greater than 500 nanometers to achieve an optimum thermal barrier. The underlayer 42 has a composition of $(Al_aCr_{1-a})N$ wherein $0.2 \leq a \leq 0.7$, and a more preferred composition of $0.5 \leq a \leq 0.69$. The top layer 46 has a composition of $(AlaCr_{1-a})N$ wherein $0.2 \leq a \leq 0.7$, and a more preferred composition of $0.5 \leq a \leq 0.69$.

In reference to the mediate multi-periodicity nanolayer coating scheme 44, it comprises a plurality of sets of alternating layer arrangements (see brackets 50, 52, 54, 56, 58, 60 and 62). There should be an appreciation that the number of alternating layer arrangements like that of bracket 50 can vary depending upon the specific application for the cutting insert. Referring to alternating layer arrangement 50, which is representative of the other alternating layer arrangements, arrangement 50 contains a base layer 64, which comprises titanium, aluminum and nitrogen. Alternating layer arrangement 50 further comprises a nanolayer region (see bracket 66).

Figure 2A:
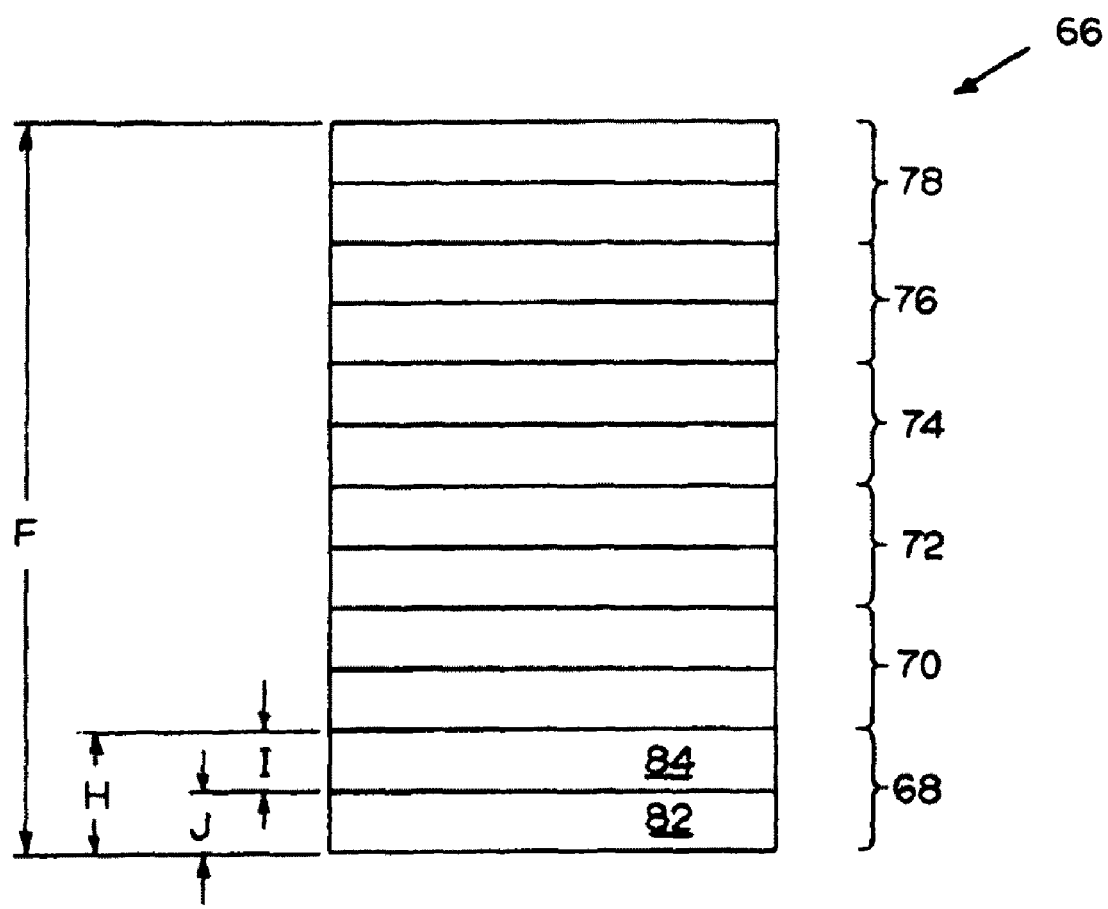
FIG. 2A is an enlarged schematic view of the nanolayer coating region of the wear-resistant coating scheme of FIG. 2

Referring to FIG. 2A, the nanolayer region 66 comprises a plurality of sets of alternating nanolayers (68, 70, 72, 74, 76 and 78) wherein one nanolayer 82 comprises aluminum, chromium, titanium and nitrogen, and another nanolayer 84 comprises aluminum, chromium, titanium and nitrogen. The contents of the aluminum, chromium, titanium and nitrogen in the one nanolayer 82 can be, and typically are at least for one of the elements, different from the contents of the aluminum, chromium, titanium and nitrogen in the other nanolayer 84. In some instances, the chromium content in the one nanolayer is almost or equals zero. In such instances, the one nanolayer has a composition of $(Ti_yAl_{1-y})N$ wherein $0.2 \leq y \leq 0.65$, and the other nanolayer has a composition of $(Ti_pAl_qCr_{1-(p+q)})N$ wherein $0.2 \leq p \leq 0.5$ and $0.01 \leq q \leq 0.65$ and $(p+q)<1$ (and more preferably $0.3 \leq p \leq 0.5$ and $0.2 \leq q \leq 0.65$ and $(p+q)<1$). In those instances in which chromium is present in both nanolayers, the one nanolayer of the set of alternating nanolayers in the nanolayer region comprising $(Ti_yCr_xAl_{1-(x+y)})N$ wherein $0 \leq x \leq 0.15$ and $0.2 \leq y \leq 0.65$, and other nanolayer of the set of alternating nanolayers in the nanolayer region comprising $(Ti_pAl_qCr_{1-(p+q)})N$ wherein $0.2 \leq p \leq 0.65$ and $0.01 \leq q \leq 0.65$ and $(p+q)<1$.

The nanolayer region 66 has a nanolayer region thickness F equal to be between about 100 nanometers and about 900 nanometers. Further, for each set of alternating nanolayers (68, 70, 72, 74, 76, 78) the alternating nanolayers (82, 84) therein have a periodicity ranging between about 2 nanometers and about 50 nanometers. The base layer 64 has a base layer thickness G, which ranges between about 100 nanometers and about 500 nanometers. The base layer 64 has a composition of $(Ti_yAl_{1-y})N$ and wherein $0.2 \leq y \leq 0.65$, and more preferably $0.3 \leq y \leq 0.6$. The base layer thickness G is smaller than the nanolayer region thickness F.

In reference to the lower transition coating layer 43, this coating layer 43 comprises a plurality of sets of alternating nanolayers like region 66. One lower transition nanolayer comprises aluminum, chromium, titanium and nitrogen, and another lower transition nanolayer comprises aluminum, chromium, titanium and nitrogen. The contents of the aluminum, chromium, titanium and nitrogen in the one lower transition nanolayer can be, and typically are at least for one of the elements, different from the contents of the aluminum, chromium, titanium and nitrogen in the other lower transition nanolayer. In some instances, the chromium content in the one lower transition nanolayer is almost or equals zero. In such instances, the one lower transition nanolayer has a composition of $(Ti_yAl_{1-y})N$ wherein $0.2 \leq y \leq 0.65$, and the other lower transition nanolayer has a composition of $(Ti_pAl_qCr_{1-(p+q)})N$ wherein $0.2 \leq p \leq 0.5$ and $0.01 \leq q \leq 0.65$ and $(p+q)<1$ (and more preferably $0.3 \leq p \leq 0.5$ and $0.2 \leq q \leq 0.65$ and $(p+q)<1$). In those instances in which chromium is present in both lower transition nanolayers, the one lower transition nanolayer comprises $(Ti_yCr_xAl_{1-(x+y)})N$ wherein $0 \leq x \leq 0.15$ and $0.2 \leq y \leq 0.65$, and other lower transition nanolayer comprises $(Ti_pAl_qCr_{1-(p+q)})N$ wherein $0.2 \leq p \leq 0.65$ and $0.01 \leq q \leq 0.65$ and $(p+q)<1$. The thickness of the lower transition coating layer ranges between about 50 nanometers and about 200 nanometers. Further, for each set of alternating nanolayers, the alternating nanolayers therein have a periodicity ranging between about 2 nanometers and about 50 nanometers.

In reference to the upper transition coating layer 45, this coating layer 45 comprises a plurality of sets of alternating upper transition nanolayers like region 66. One upper transition nanolayer comprises aluminum, chromium, titanium and nitrogen, and another nanolayer comprises aluminum, chromium, titanium and nitrogen. The contents of the aluminum, chromium, titanium and nitrogen in the one upper transition nanolayer can be, and typically are at least for one of the elements, different from the contents of the aluminum, chromium, titanium and nitrogen in the other upper transition nanolayer. In some instances, the chromium content in the one upper transition nanolayer is almost or equals zero. In such instances, the one upper transition nanolayer has a composition of $(Ti_yAl_{1-y})N$ wherein $0.2 \leq y \leq 0.65$, and the other upper transition nanolayer has a composition of $(Ti_pAl_qCr_{1-(p+q)})N$ wherein $0.2 \leq p \leq 0.5$ and $0.01 \leq q \leq 0.65$ and $(p+q)<1$ (and more preferably $0.3 \leq p \leq 0.5$ and $0.2 \leq q \leq 0.65$ and $(p+q)<1$). In those instances in which chromium is present in both upper transition nanolayers, the one upper transition nanolayer comprises $(Ti_yCr_xAl_{1-(x+y)})N$ wherein $0 \leq x \leq 0.15$ and $0.2 \leq y \leq 0.65$, and other upper transition nanolayer comprises $(Ti_pAl_qCr_{1-(p+q)})N$ wherein $0.2 \leq p \leq 0.65$ and $0.01 \leq q \leq 0.65$ and $(p+q)<1$. The thickness of the upper transition coating layer ranges between about 50 nanometers and about 200 nanometers. Further, for each set of alternating nanolayers, the alternating nanolayers therein have a periodicity ranging between about 2 nanometers and about 50 nanometers.

The underlayer 42 has an underlayer thermal conductivity. The base layer 64 has a base layer thermal conductivity. The underlayer thermal conductivity is less than the base layer thermal conductivity. The top layer 46 has a top layer thermal conductivity wherein the top layer thermal conductivity is less than the base layer thermal conductivity.

In regard to the composition of the wear-resistant coating scheme, any one or more of the underlayer and the top layer and the mediate multi-periodicity nanolayer coating scheme may, in addition to or in place of the already mentioned metallic elements, each further comprise one or more of the metals from Group IVb, Vb and VIb of the Periodic Table and silicon. More specifically, any one or more of the underlayer and the top layer and the mediate multi-periodicity nanolayer coating scheme may, in addition to or in place of titanium, chromium, and aluminum, each further comprise one or more of tungsten, vanadium, molybdenum, niobium, and silicon.

There should be an appreciation that carbon can be added to the nitrogen in the above compositions for the underlayer, the top layer, and the mediate multi-periodicity nanolayer coating scheme. In such a situation, the underlayer has a composition of $(Al_aCr_{1-a})C_sN_t$, wherein $0.2 \leq a \leq 0.7$ (and more preferably $0.5 \leq a \leq 0.69$), and s+t=1. The top layer has a composition of $(Al_aCr_{1-a})C_sN_t$ wherein $0.2 \leq a \leq 0.7$ (and more preferably $0.5 \leq a \leq 0.69$) and s+t=1. Referring to the set of alternating layer arrangements (e.g., 50), the base layer has a composition of $(Ti_yAl_{1-y})C_sN_t$ and wherein $0.2 \leq y \leq 0.65$ (and more preferably $0.3 \leq y \leq 0.6$) and s+t=1. In the situation where the one nanolayer (e.g., nanolayer 82 in set 68) does not contain chromium and the other nanolayer (e.g., nanolayer 84 in set 68) contains chromium, the one nanolayer has a composition of $(Ti_yAl_{1-y})C_sN_t$ wherein $0.2 \leq y \leq 0.65$ (and more preferably $0.3 \leq y \leq 0.6$) and s+t=1, and the other nanolayer has a composition of $(Ti_pAl_qCr_{1-(p+q)})C_sN_t$ wherein $0.2 \leq p \leq 0.5$ and $0.01 \leq q \leq 0.65$ and $(p+q)<1$ (and more preferably $0.3 \leq p \leq 0.5$ and $0.2 \leq q \leq 0.65$ and $(p+q)<1$) and s+t=1. In another situation where both nanolayers contain chromium, the one nanolayer of the set of alternating nanolayers in the nanolayer region comprises $(Ti_yCr_xAl_{1-(x+y)})C_sN_t$ wherein $0 \leq x \leq 0.15$ and $0.2 \leq y \leq 0.65$ and s+t=1, and the other nanolayer of the set of alternating nanolayers in the nanolayer region comprises $(Ti_pAl_qCr_{1-(p+q)})C_sN_t$ wherein $0.2 \leq p \leq 0.5$ and $0.01 \leq q \leq 0.65$ and $(p+q)<1$ and s+t=1. In the other situation, there should be an appreciation that the chromium may be different between the two nanolayers.

There should be an appreciation that the wear-resistant coating scheme can include non-metallic components other than carbon and/or nitrogen. In this regard, the wear resistant coating scheme includes an underlayer containing aluminum and chromium and X, and a top layer containing aluminum and chromium and X. The underlayer is closest to the substrate and the top layer is farthest from the substrate. The wear-resistant coating scheme further includes a mediate multi-periodicity nanolayer coating scheme that is mediate of the underlayer and the top layer.

Further, in the situation wherein the wear-resistant coating scheme can include non-metallic components other than carbon and/or nitrogen, the mediate multi-periodicity nanolayer coating scheme contains titanium, aluminum, chromium and X. The mediate multi-periodicity nanolayer coating scheme comprises a plurality of alternating layer arrangements wherein each one of the alternating layer arrangements comprises a base layer comprising titanium, aluminum and X and a nanolayer region comprising alternating nanolayers wherein one nanolayer comprises titanium, aluminum, chromium and X and another nanolayer comprises aluminum, chromium, titanium and X. In this coating arrangement and for all of the coating layers, X can comprise any one of the following nitrogen, carbon, boron, carbon and nitrogen, boron and nitrogen, carbon and boron and nitrogen, nitrogen and oxygen, carbon and oxygen, boron and oxygen, carbon and nitrogen and oxygen, boron and nitrogen and oxygen, and carbon and boron and nitrogen and oxygen.

Table 1 sets forth the typical dimensions of a coating scheme as such set forth in FIGS. 2 and 2A.

TABLE 1

Typical Dimensions for Coating Scheme of FIGS. 2 and 2A

| Dimension | Description | Example (nanometers) | Range (nanometers) |
|---|---|---|---|
| A* | overall thickness of the coating scheme | 5120 | 1500-15,000 |
| B | thickness of underlayer (42) | 200 | 20-500 |
| C* | thickness of mediate multi-periodicity nanolayer coating scheme (44) | 4160 | 1000-11,000 |
| D | thickness of top layer (46) | 600 | 300-2000 |

TABLE 1-continued

Typical Dimensions for Coating Scheme of FIGS. 2 and 2A

| Dimension | Description | Example (nanometers) | Range (nanometers) |
|---|---|---|---|
| E | thickness of alternating layer arrangement (50) [combined thickness of nanolayer region (66) and base layer (64)] | 520 | 200-1400 |
| F | thickness of nanolayer region (66) | 350 | 100-900 |
| G | thickness of base layer (64) | 170 | 100-500 |
| H | thickness of one pair (68) of alternating nanolayers | 4** | 2-50 |
| I | thickness of one nanolayer (82) | 1.3** | 1-16 |
| J | thickness of other nanolayer (84) | 2.7** | 1-34 |
| X | thickness of lower transition coating layer (43) | 80 | 50-200 |
| Y | thickness of upper transition coating layer (45) | 80 | 50-200 |

*The overall thickness (A) of the coating scheme can be controlled by controlling the thickness of the mediate multi-periodicity layer (C), which can be controlled by changing the number of the repeated layers.
**Measured by transmission electron microscopy (TEM) analysis.

Figure 3:
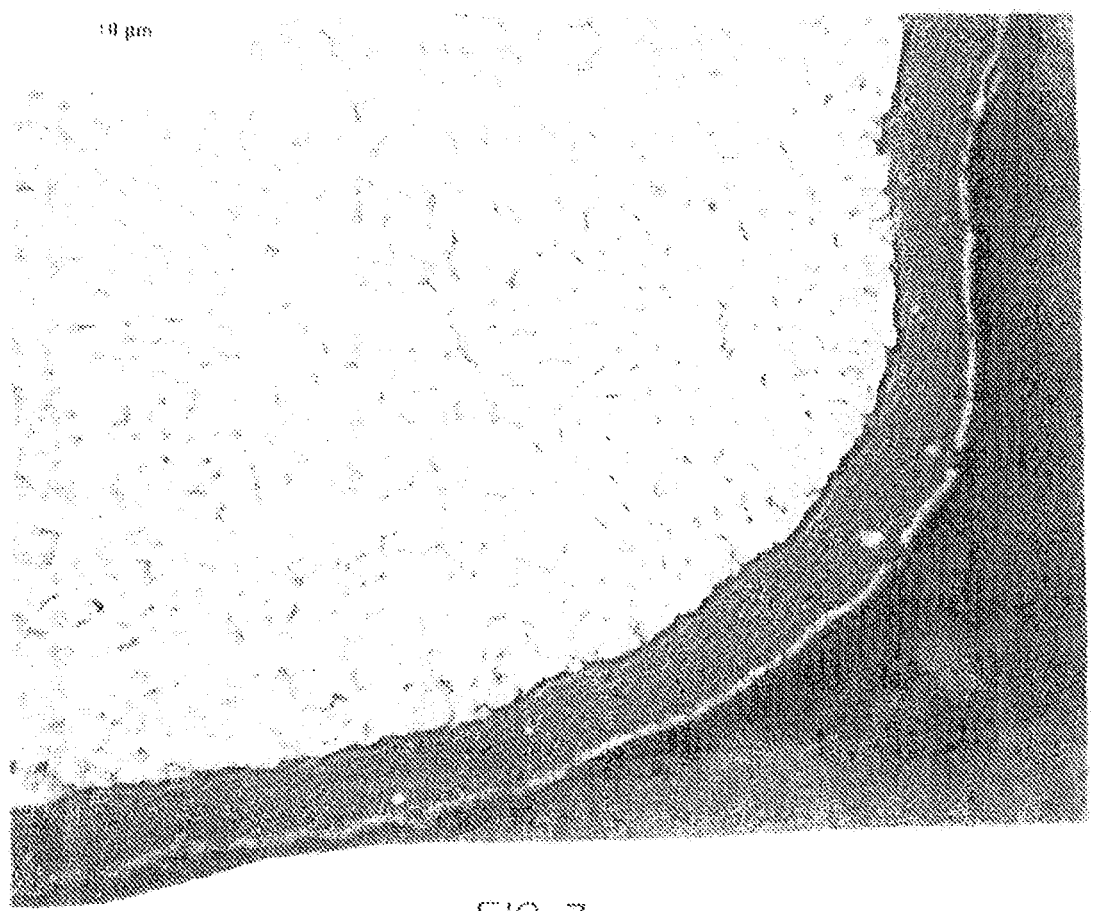
FIG. 3 is a photomicrograph (with a 10 µm scale) taken via optical microscopy of a specific embodiment of the cross-section of a coating scheme of the invention that shows the corner cutting edge of a coated cutting insert.

FIG. 3 is a photomicrograph (with a 10 μm scale) taken via optical microscope of a specific embodiment of a coating scheme of the invention (Inventive Specimen No. 1) that shows the corner cutting edge of a coated cutting insert. The substrate comprises cemented (cobalt) tungsten carbide that has a composition of about 10.5 weight percent cobalt, about 6.3 weight percent tantalum, about 5.4 weight percent titanium, and about 3.1 weight percent niobium with the balance being tungsten carbide grains. The substrate has the following properties: a density (measured according to the procedure in ASTM B311) equal to about 12.3 grams per cubic centimeter, a coercive force (Hc) (measured according to ASTM B887) equal to about 180 oersteds, a grain size (determined by reference to the comparative chart in ASTM B390) equal to about 1-6 micrometers, and a hardness equal to about 91.5 Rockwell A. FIG. 3 shows that the wear-resistant coating scheme comprises an underlayer that is of a thickness equal to about 200 nanometers and has a composition of aluminum and chromium and nitrogen. The wear-resistant coating scheme also has a top layer that is of a thickness equal to about 600 nanometers and has a composition of aluminum and chromium and nitrogen.

Still referring to FIG. 3, the wear-resistant coating scheme also has a mediate multi-periodicity nanolayer coating scheme, which is mediate of the upper transition layer and the lower transition layer. The mediate multi-periodicity nanolayer coating scheme comprises a plurality of alternating layer arrangements wherein each one of the alternating layer arrangements comprises a base layer comprising titanium, aluminum and nitrogen and a nanolayer region comprising alternating nanolayers wherein one nanolayer comprises aluminum, chromium, titanium and nitrogen and another nanolayer comprises aluminum, chromium, titanium and nitrogen.

For each alternating layer arrangement of which there are eight, the base layer has a thickness of about 170 nanometers and the nanolayer region has a thickness equal to about 350 nanometers. The total thickness of the wear-resistant coating scheme is equal to about 5120 nanometers (i.e., 200 nm+80 nm+8×(170 nm+350 nm)+80 nm+600 nm). In the nanolayer region, the total thickness for each set of alternating nanolayers is equal to about 4 nanometers so that the total thicknesses of the TiAlCrN Region (Cr-poor) and AlCrTiN Region (Cr-rich) is equal to about 4 nanometers. The ratio of thicknesses of the TiAlCrN Region (Cr-poor) and AlCrTiN Region (Cr-rich), i.e., TiAlCrN Region (Cr-poor):AlCrTiN Region (Cr-rich), is equal to about 2:1.

Figure 4:
FIG. 4 is photomicrograph (with a 10 nm scale) taken via transmission electron microscopy (TEM) of the nanolayer coating region of a specific embodiment of a coating scheme of the invention.

FIG. 4 is photomicrograph (with a 10 nm scale) taken via transmission electron microscopy (TEM) in the nanolayer region of Inventive Specimen No. 1. The chemistry of the nanolayer region of Inventive Specimen No. 1 is set forth in Table 2.

TABLE 2

Elemental Metallic Composition of Nanolayer Region of Inventive Specimen No. 1 in Atomic Ratio

| | Region | |
|---|---|---|
| Element | TiAlCrN Region (Cr-poor) (Atomic Ratio) | AlCrTiN Region (Cr-rich) (Atomic Ratio) |
| aluminum | 0.483 | 0.519 |
| titanium | 0.494 | 0.354 |
| chromium | 0.023 | 0.127 |

Figure 4A:
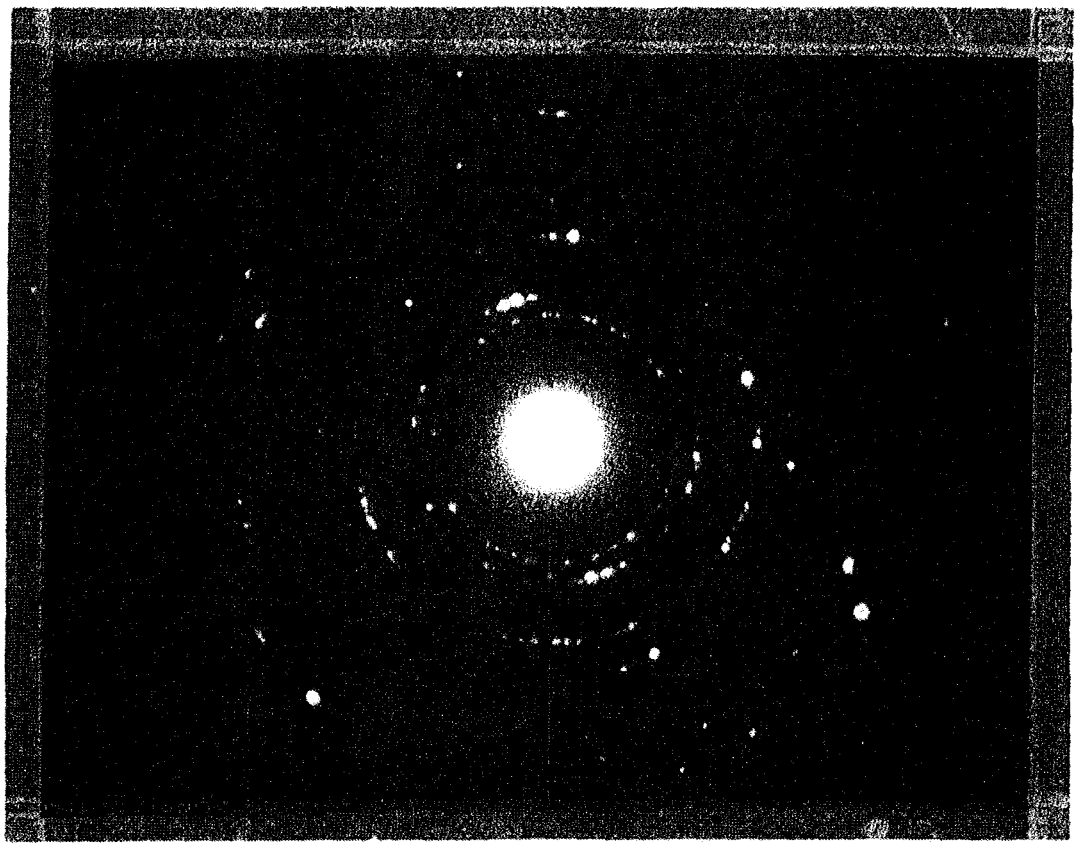
FIG. 4A is a diffraction pattern taken via TEM that shows the face centered cubic (FCC) crystal structure of a specific embodiment of the wear-resistant coating scheme.

FIG. 4A is a selected area diffraction pattern taken via TEM that shows the face centered cubic (FCC) crystal structure of Inventive Specimen No. 1 of the wear-resistant coating scheme. This is evident from the characteristic relative diameters of the rings of the diffraction pattern.

Figure 5:
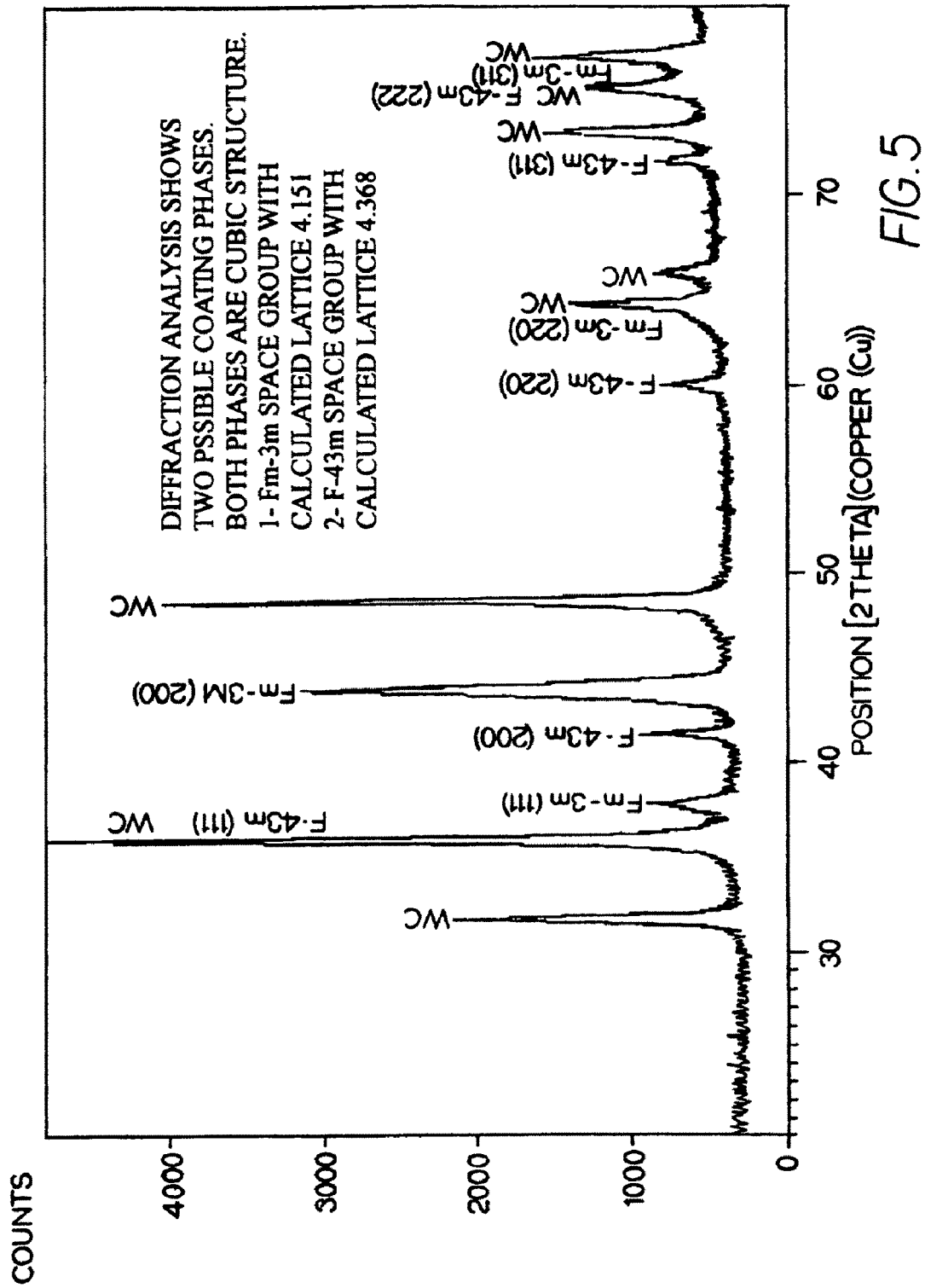
FIG. 5 is an x-ray diffraction graph of the wear-resistant coating scheme that shows the presence of two face centered cubic (FCC) crystal structures (i.e., Fm-3m structure with a lattice parameter=0.4151 nm according to FIG. 5 and F-43m structure with a lattice parameter=0.4368 nm) according to FIG. 5.

FIG. 5 is an x-ray diffraction pattern of the wear-resistant coating scheme of Inventive Specimen No. 1 that shows the presence of two face centered cubic (FCC) crystal structures. The counts are set forth along the vertical axis and the position (2 theta) is set out along the horizontal axis.

One preferred coating apparatus useful for the application of the coating scheme is shown and described in European Patent No. 1 186 681, as well as in U.S. Pat. No. 7,025,863 to Seeli et al. Each one of these patent documents are hereby incorporated by reference herein.

In regard to the application of specific embodiments of the wear-resistant coating scheme of the invention by the above-referred PVD system, the deposition of the multilayer Ti—Al—(X)—N/Al—Cr—(X)—N-coatings were performed using an industrial coating system (Type RCS, INNOVA) of the company Oerlikon Balzers Coating. A description of this coating system is described in European Patent No 1 186 681 in FIG. 3 through 6 with a written description in Column 7, line 18 through Column 9, line 25, wherein the above European patent is hereby incorporated by reference herein. The United States equivalent to the above European patent is U.S. Pat. No. 7,025,863 to Seeli et al., and the corresponding text is at Column 6, line 22 through Column 7, line 54 wherein the above United States patent is hereby incorporated by reference herein.

To produce these coatings cleaned parts, especially carbide inserts, related to their diameter were mounted either using double or triple rotation on a substrate carousel and four melting metallurgical manufactured Ti—Al-targets and two powder metallurgical manufactured Al—Cr—(X)-targets which were placed in six cathodic arc sources on the side walls of the coating chamber. The geometry of the arrangement of the targets is mainly defined by the octagonal layout of the RCS (Oerlikon Balzers) coating system in which two opposite to each other arranged heating segments separate two groups of segments having three consecutive arranged arc cathodes. For the present experiments, an Al—Cr-Target was mounted opposite in each middle position of one segment, but in principal various target arrangements can be used for deposition of this kind of coatings. At least two arc cathodes in a geometrically equivalent position have to be used for depositing these coatings.

Subsequently, the parts, which should be coated, were heated up to around 500° C. by using radiation heaters which are permanently mounted in the coating system. After the heating step the surface of the parts was cleaned by Argon etching using a DC bias voltage of −100 to −250V in an Argon atmosphere at a pressure of 0.2 Pa.

Following two Al—Cr-sources, using a power of 3 kW and a substrate bias voltage of −40V during a time of around 18 minutes, were used to form an Al—Cr—N underlayer with a thickness of around 0.2 μm. Then, two Al—Cr targets and four Ti—Al targets were used to deposit the lower Ti—Al—Cr—N transition layer for two minutes. Afterwards an alternating layer arrangement coating was deposited where at first four Ti—Al-sources at a power of approximately 5 kW were used for a time of around 5 minutes and at second the two Al—Cr-sources were switched on additionally to the four running Ti—Al-sources that a Ti—Al—Cr—N layer was formed. All six sources together ran for approximately 7 minutes. For the existing embodiment this layer package was repeated several times to get a given coating thickness of the completed mediate multi-periodicity nanolayer. Then, two Al—Cr targets and four Ti—Al targets were used to deposit the upper Ti—Al—Cr—N transition layer for two minutes. At the end, again, an Al—Cr—N toplayer, using the same parameters as for the underlayer and a coating time of around 60 minutes, with a thickness of 0.6 μm was deposited. All coatings were deposited in nitrogen atmosphere at a pressure of approximately 3 Pa and a bias voltage of around −40V. In general, the working pressure for each single layer can be in the range of 0.5 to 8 Pa, but preferred between 0.8 and 5 Pa. For the deposition of nitrides, a pure nitrogen atmosphere or a mixture of nitrogen and a noble gas, like argon can be employed whereas, a mixture of nitrogen and a carbon containing gas can be used for the deposition of carbonitrides. Furthermore for the production of oxygen or boron containing films oxygen or boron containing gases can be mixed into the coating process.

The following examples demonstrate the utility and performance of the coated cutting insert, as well as the wear-resistant coating scheme, of the invention.

Test 1 comprises a test of six coated cutting inserts labeled Experiments 1 through 6. Experiments 1 through 5 represent the actual state-of-the-art coated cutting inserts in the commercial market. Experiment 6 is the inventive coated cutting insert. Test 1 compares the performance of high speed face milling in alloy steels using a cemented carbide insert of the following geometry: SDPT1204PDSRGB2. The workpiece material is alloy steel 4140 (DIN 1.7225, 42CrMo4). The cutting parameters are set forth below: cutting speed $v_c$=300 m/min; Feed rate $f_z$=0.2 mm/tooth; Depth of cut ap=4 mm; Width of cut ae=61 mm; Pass length l=610 mm; Coolant: dry; and wear criterion: $v_{b,max}$=0.3 mm. The test results are set forth in Table 3 below.

TABLE 3

Test Results in high speed face milling in alloy steels for Test 1

| Experiment No./Coating Description | Coating thickness [μm] | Number of passes* |
|---|---|---|
| 1 TiN + TiCN + TiN (PVD TiCN based) | 3.5 | 4 |
| 2 TiN + AlTiN + TiN (PVD AlTiN based) | 4.0 | 1 |
| 3 TiN + TiCN + CVD-kappa-Al$_2$O$_3$ | 6.5 | 3.5 |
| 4 TiN + TiCN + CVD-alpha-Al$_2$O$_3$ | 6.1 | 5 |
| 5 TiN + TiCN + Al$_2$O$_3$ + TiN (CVD) | 9.9 | 4.5 |
| 6 AlCrN + TiAlN/AlCrN-multilayer + AlCrN | 5.0 | 9.5 |

*at a wear criterion of $v_{b,max}$ = 0.3 mm.

Test 1 shows a comparison of the lifetime of coated cemented carbide inserts in a high speed cutting application. These results show that the inventive coated cutting insert (i.e., Experiment 6) exhibits an increase in lifetime by a factor greater than two compared to Experiment 1 the commercial tool benchmark.

Test 2 comprises a test of five coated cutting inserts (Experiments 7 through 11) wherein Experiment No. 7 is an inventive coated cutting insert. Experiments 8-11 represent coated cutting inserts that have other coating schemes thereon. Target composition, coating, thickness, adhesion and microhardness of experiments 7 through 11 are presented in Table 4. Process parameters such as target power, substrate bias voltage, working pressure and deposition temperature are shown in Table 5. Test 2 comprises the high speed face milling in alloy steel using cemented carbide inserts of the following geometry: SDPT1204PDSRGB2. The workpiece material is an alloy steel 4140 (DIN 1.7225, 42CrMo4). The cutting parameters are as follows: cutting speed $v_c$=300 m/min; Feed rate $f_z$=0.2 mm/tooth; Depth of cut ap=4 mm; Width of cut ae=61 mm; Pass length l=610 mm; Coolant: dry; and Wear criterion: $v_{b,max}$=0.3 mm. The test results for Test 2 are set forth in Table 6 below.

TABLE 4

Target Compositions and Resultant Coating Properties

| Experiment No. | target composition | | | | | coating thickness [μm] | adhesion* | micro-hardness [HV0.03] |
|---|---|---|---|---|---|---|---|---|
| | target 1 | | target 2 | | | | | |
| | Al at % | Cr at % | Ti at % | Al at % | X at % | | | |
| 7 | 70 | 30 | 50 | 50 | — | 5 | HF1 | 2609 |
| 8 | 70 | 30 | 50 | 50 | — | 4.9 | HF1 | 2690 |
| 9 | 70 | 30 | 45 | 45 | Si = 10 | 4.8 | HF1 | 2635 |
| 10 | 70 | 30 | 20 | 65 | Cr = 15 | 5.1 | HF1 | 2846 |
| 11 | 70 | 30 | 42.5 | 42.5 | Cr = 15 | 4.9 | HF1 | 2466 |

*as measured per the Union of German Engineers Guidelines VDI3198 and VDI3824-4

TABLE 5

Experimental Process Parameters

| Experiment No. | PTarget1 [kW] | PTarget2 [kW] | USubstrate [V] | pN2 [Pa] | Temp. [° C.] |
|---|---|---|---|---|---|
| 7 | 3 | 5 | −40 | 3 | 500 |
| 8 | 3 | 5 | −40 | 3 | 500 |
| 9 | 3 | 5 | −40 | 3 | 500 |
| 10 | 3 | 3 | −40 | 3 | 500 |
| 11 | 3 | 5 | −40 | 3 | 500 |

TABLE 6

Test Results in high speed face milling in alloy steels for Test 2

| Experiment No./Coating Description | Coating thickness [μm] | Number of passes*** |
|---|---|---|
| 7 AlCrN + TiAlN/AlCrN-multilayer + AlCrN* | 5 | 9.5 |
| 8 AlCrN + TiAlN/AlCrN-multilayer + AlCrN** | 5 | 5 |
| 9 AlCrN + TiAlSiN/AlCrN-multilayer + AlCrN | 5 | 7 |
| 10 AlCrN + AlTiCrN/AlCrN-multilayer + AlCrN | 5 | 8 |
| 11 AlCrN + TiAlCrN/AlCrN-multilayer + AlCrN | 5 | 5.5 |

*Coating in experiment 7 is the same as experiment 6.
**In experiment 8, four AlCr targets and two TiAl targets are used, while in experiment 7 two AlCr targets and four TiAl targets are used.
***At a wear criterion of $V_{b,max}$ = 0.3 mm.

It is apparent that in Experiments 7 to 11 various target materials were used to deposit different kinds of multilayer coatings. Already improvements in comparison to the benchmark coatings (see Experiment 1 in Example 1) could be observed, but the coating, which is described in the invention (Experiment 7), showed the most promising performance.

Test 3 comprises a test of two coated cutting inserts (i.e., Experiments 12 and 13) in the face milling in carbon steel. The coated cutting inserts were cemented carbide inserts that had the following geometry: SDMT1205PDR-HQ-M. The workpiece material was carbon steel 1045 (DIN 1.1191, Ck45). The cutting parameters were as follows: cutting speed $v_c$=350 m/min; Feed rate $f_z$=0.2 mm/tooth; Depth of cut ap=4 mm; Coolant: dry; and wear criterion: $v_{b,max}$=0.3 mm. Table 7 presents the test results.

TABLE 7

Test Results in face milling in carbon steel for Test 3

| Experiment No./Coating Description | Lifetime [min] | Notch wear [mm] | Corner Wear [mm] |
|---|---|---|---|
| 12 AlCrN + TiAlN/AlCrN-multilayer + AlCrN* | 21.6 | 0.29 | 0.14 |
| 13 TiN + TiAlN** | 8.2 | 0.31 | 0.14 |

*coating in experiment 12 is the same as in experiment 6 and 7.
**state-of-the-art coating available on this tool in the market In Test 3, a coated cutting insert of the invention (Experiment 12) was tested against the state-of-the-art coated cutting insert (Experiment 13). A significant 2.6 times increase in lifetime could be observed in this cutting test. The maximum wear was found as a notch wear on the tool flank.

Test 4 comprises a test of three coated cutting inserts (Experiments 14-16) in the face milling in alloy steel using a cemented carbide insert of the following geometry: SDMT1205PDR-HQ-M. The workpiece material is an alloy steel 4140 (DIN 1.7225, 42CrMo4). The cutting parameters are as follows: cutting speed $v_c$=180 m/min; Feed rate $f_z$=0.2 mm/tooth; Depth of cut ap=4 mm; Coolant: dry; and wear criterion: $v_{b,max}$=0.3 mm. Table 8 presents the results of Test 4.

TABLE 8

Test Results in face milling in alloy steel of Test 4

| Experiment No./Coating Description | Lifetime [min] | Notch wear [mm] | Corner Wear [mm] |
|---|---|---|---|
| 14 AlCrN + TiAlN/AlCrN-multilayer + AlCrN* | 11.9 | 0.286 | 0.3 |
| 15 TiN + TiAlN** | 6.2 | 0.314 | 0.3 |
| 16 TiN + TiAlN** | 6.3 | 0.266 | 0.3 |

*coating in experiment 14 is the same as coating in experiment 6, 7, and 12.
**state-of-the-art coating available on this tool in the market The result of Test 4 show again a comparison of the coated cutting insert invention (i.e., Experiment 14) against the standard available coating on this kind of inserts in the market (Experiments 15 and 16). This test was done at moderate cutting speeds. A performance increase of eighty-nine percent (89%) as compared to Experiment 16 could be detected. In this test the maximum wear could be observed on the corner of the cutting tool.

Test 5 comprises a test of four coated cutting inserts in medium high speed drilling in Gray Cast Iron using KSEM style modular cemented carbide drilling inserts. The workpiece material was Class 40 Gray Cast Iron (~250 BHN). The cutting parameters were as follows: cutting speed $v_c$=198 m/min; Feed rate $f_z$=0.35 mm/tooth; Drill diameter=12.5 mm; Hole depth=62 mm; Coolant: Castrol Syntilo synthetic emulsion, with the mode of delivery through tool cooling with pressure 15 bar. The wear criterion was $v_{b,max}$=0.38 mm. The results are set forth in Table 9 below.

TABLE 9

Test Results in medium high speed drilling for Test 5

| Experiment No./Coating Description | Cutting length [m] | Corner Wear [mm] |
|---|---|---|
| 17 AlCrN + TiAlN/AlCrN-multilayer + AlCrN | 73.9 | 0.5 |
| 18 TiN + TiAlN | 45.4 | 0.74 |
| 19 AlTiN | 45.4 | 0.75 |
| 20 TiN/TiAlN nanolayer | 34.1 | 0.73 |

The results of Test 5 show again a comparison of the inventive coated cutting insert (Experiment 17) against the standard available coating on this kind of modular inserts for drilling in the market (Experiments 18-20). This test was done at medium high cutting speeds. A performance increase of close to sixty-three percent (63%) could be detected. In this test, the maximum wear could be observed on the corner of the cutting tool.

It is apparent that the wear-resistant coating scheme of the present invention exhibits advantages over earlier coating schemes. In particular, the wear-resistant coating scheme of the present invention exhibits a lower thermal conductivity by using selected coating sequences and coating compositions. Such parameters affect the thermal conductivity of the whole coating, and thus, influence the extent of heat transfer from the cutting insert-chip interface (or contact zone chip-coating surface) to the substrate and coating-substrate interface. Reduction in heat transfer to the substrate and the coating-substrate interface results in a reduction (or minimization) or delay of thermal crack formation within the substrate. The delay or reduction of thermal cracking in the substrate typically increases the useful life of the cutting insert.

More specifically, it is apparent that use of the aluminum chromium nitride top coating layer helps to impede the transfer of a significant amount of heat from the cutting insert-chip interface to the substrate and coating-substrate interface. One result is that much of the heat remains in the chip. Another result is that heat that transfers into the top coating layer will spread in all directions within the titanium aluminum nitride coating layer because the heat transport occurs in all directions (e.g., in a direction perpendicular, as well as parallel to the surface). This decreases the concentration of heat generated at the top coating-chip contact area near the cutting edge, dissipating the heat over a larger surface area and decreasing the temperature from the top coating down to the substrate-coating interface. The combination of the coating layers in the multilayer-nanolayer coating sequence within the base layer is that heat transfer is alternatively blocked or spread away from the substrate. Finally, the presence of another aluminum chromium nitride coating layer between the substrate and the base layer helps to protect the substrate and the coating-substrate interface against the heat transfer.

The principal emphasis of the above description of the specific embodiments is on coated cutting inserts use in a chipforming material removal operation. However, there should be an understanding that coated cutting inserts are but one specific embodiment of inventive coated articles. There is the contemplation that the coated article encompass other coated articles such as, for example, wear components.

The patents and other documents identified herein are hereby incorporated by reference herein. Other embodiments of the invention will be apparent to those skilled in the art from a consideration of the specification or a practice of the invention disclosed herein. It is intended that the specification and examples are illustrative only and are not intended to be limiting on the scope of the invention. The true scope and spirit of the invention is indicated by the following claims.

What is claimed is:

1. A coated cutting insert for use in a chipforming material removal operation, the cutting insert comprising:
   a substrate and a wear-resistant coating scheme wherein the wear-resistant coating scheme comprising:
   a mediate multi-periodicity nanolayer coating scheme containing titanium, aluminum, chromium and nitrogen; and
   the mediate multi-periodicity nanolayer coating scheme comprising a plurality of sets of alternating layer arrangements wherein each one of the alternating layer arrangements comprises a base layer comprising titanium, aluminum and nitrogen and a nanolayer region comprising a plurality of sets of alternating nanolayers wherein each set of alternating nanolayers comprises one nanolayer comprising aluminum, chromium, titanium and nitrogen and another nanolayer comprising aluminum, chromium, titanium and nitrogen, and the base layer having a base layer thickness and the nanolayer region having a nanolayer region thickness wherein the base layer thickness is smaller than the nanolayer region thickness.

2. The coated cutting insert according to claim 1 wherein the base layer comprising $(Ti_yAl_{1-y})N$ wherein $0.2 \leq y \leq 0.65$; and the one nanolayer of the set of alternating nanolayers in the nanolayer region comprising $(Ti_yCr_xAl_{1-(x+y)})N$ wherein $0 < x \leq 0.15$ and $0.2 \leq y \leq 0.65$, and other nanolayer of the set of alternating nanolayers in the nanolayer region comprising $(Ti_pAl_qCr_{1-(p+q)})N$ wherein $0.2 \leq p \leq 0.65$ and $0.01 \leq q \leq 0.65$ and $(p+q) < 1$.

3. The coated cutting insert according to claim 1 wherein the wear-resistant coating scheme further including:
   an underlayer containing aluminum, chromium and nitrogen;
   a top layer containing aluminum, chromium and nitrogen, and wherein the underlayer being closer to the substrate than the top layer;
   a lower transition coating region comprising a plurality of sets of alternating lower transition nanolayers wherein each set of alternating lower transition nanolayers comprises one lower transition nanolayer comprising aluminum, chromium, titanium and nitrogen and another lower transition nanolayer comprising aluminum, chromium, titanium and nitrogen, and the lower transition coating region providing a transition between the mediate multi-periodicity nanolayer coating scheme and the underlayer;
   an upper transition coating region comprising a plurality of sets of alternating upper transition nanolayers wherein each set of alternating nanolayers comprises one upper transition nanolayer comprising aluminum, chromium, titanium and nitrogen and another upper transition nanolayer comprising aluminum, chromium, titanium and nitrogen, and the upper transition coating region providing a transition between the mediate multi-periodicity nanolayer coating scheme and the top layer; and
   the mediate multi-periodicity nanolayer coating scheme being mediate of the lower transition coating region and the upper transition coating region.

4. The coated cutting insert according to claim 3 wherein the lower transition coating region having a lower transition thickness, the upper transition coating region having an upper transition thickness, and wherein the lower transition thickness being less than the nanolayer region thickness, and the upper transition thickness being less than the nanolayer region thickness.

5. The coated cutting insert according to claim 3 wherein the underlayer being of an underlayer thickness ranging between about 20 nanometers and about 500 nanometers, and the top layer being of a top layer thickness ranging between about 300 nanometers and about 2000 nanometers; each set of the alternating layer arrangements being of a thickness ranging between about 200 nanometers and about 1400 nanometers; and the sets of alternating nanolayers having a periodicity ranging between about 2 nanometers and about 50 nanometers.

6. The coated cutting insert according to claim 3 wherein:
   the underlayer comprising $(Al_aCr_{1-a})N$, and wherein $0.2 \leq a \leq 0.7$;
   the top layer comprising $(Al_aCr_{1-a})N$, and wherein $0.2 \leq a \leq 0.7$;
   the one upper transition nanolayer comprising $(Ti_yCr_xAl_{1-(x+y)})N$ wherein $0 < x \leq 0.15$ and $0.2 \leq y \leq 0.65$, and other upper transition nanolayer comprising $(Ti_pAl_qCr_{1-(p+q)})N$ wherein $0.2 \leq p \leq 0.5$ and $0.01 \leq q \leq 0.65$ and $(p+q) < 1$; and
   the one lower transition nanolayer comprising $(Ti_yCr_xAl_{1-(x+y)})N$ wherein $0 < x \leq 0.15$ and $0.2 \leq y \leq 0.65$, and other lower transition nanolayer comprising $(Ti_pAl_qCr_{1-(p+q)})N$ wherein $0.2 \leq p \leq 0.5$ and $0.01 \leq q \leq 0.65$ and $(p+q) < 1$.

7. The coated cutting insert according to claim 3 wherein the underlayer having an underlayer thermal conductivity and the base layer having a base layer thermal conductivity, and the underlayer thermal conductivity being less than the base layer thermal conductivity; and the top layer having a top layer thermal conductivity, and the top layer thermal conductivity being less than the base layer thermal conductivity.

8. The coated cutting insert according to claim 3 wherein the underlayer, the top layer, the upper transition coating region, the lower transition coating region, and the mediate multi-periodicity nanolayer coating scheme each further comprising one or more of the metals from Group IVb, Vb and VIb of the Periodic Table and aluminum and silicon.

9. The coated cutting insert according to claim 3 wherein the underlayer, the top layer, the upper transition coating region, the lower transition coating region, and the mediate multi-periodicity nanolayer coating scheme each being applied by physical vapor deposition.

10. The coated cutting insert according to claim 1 wherein the mediate multi-periodicity nanolayer coating scheme further comprising carbon, and the base layer comprising $(Ti_yAl_{1-y})C_sN_t$ and wherein $0.2 \leq y \leq 0.65$ and $s+t=1$, the one nanolayer of the set of alternating nanolayers in the nanolayer region comprising $(Ti_yCr_xAl_{1-(x+y)})C_sN_t$ wherein $0<x \leq 0.15$ and $0.2 \leq y \leq 0.65$ and $s+t=1$, and the other nanolayer of the set of alternating nanolayers in the nanolayer region comprising $(Ti_pAl_qCr_{1-(p+q)})C_sN_t$ wherein $0.2 \leq p \leq 0.5$ and $0.01 \leq q \leq 0.65$ and $(p+q)<1$ and $s+t=1$.

11. The coated cutting insert according to claim 1 wherein the wear-resistant coating scheme further including:
   an underlayer comprising aluminum, chromium, nitrogen and carbon according to the formula $(Al_aCr_{1-a})C_sN_t$, and wherein $0.2 \leq a \leq 0.7$, and $s+t=1$;
   a top layer comprising aluminum, chromium, nitrogen and carbon according to the formula $(Al_aCr_{1-a})C_sN_t$ and wherein $0.2 \leq a \leq 0.7$, and $s+t=1$;
   the underlayer being closer to the substrate than the top layer;
   a lower transition coating region comprising a plurality of sets of alternating lower transition nanolayers wherein each set of alternating lower transition nanolayers comprises one lower transition nanolayer comprising aluminum, chromium, titanium, nitrogen and carbon and another lower transition nanolayer comprising aluminum, chromium, titanium, nitrogen and carbon, and the lower transition coating region providing a transition between the mediate multi-periodicity nanolayer coating scheme and the underlayer;
   an upper transition coating region comprising a plurality of sets of alternating upper transition nanolayers wherein each set of alternating nanolayers comprises one upper transition nanolayer comprising aluminum, chromium, titanium, nitrogen and carbon and another upper transition nanolayer comprising aluminum, chromium, titanium, nitrogen and carbon, and the upper transition coating region providing a transition between the mediate multi-periodicity nanolayer coating scheme and the top layer; and
   the mediate multi-periodicity nanolayer coating scheme being mediate of the lower transition coating region and the upper transition coating region.

12. The coated cutting insert according to claim 1 wherein the cutting insert having rake surfaces and flank surfaces, the rake surfaces intersecting the flank surfaces to form cutting edges at the intersection thereof.

13. The coated cutting insert according to claim 1 wherein the substrate comprising one of the following: high speed steel, cemented carbides including cobalt-tungsten carbide, ceramics including SiAlON and alumina and silicon nitride, cermets, and superhard materials including sintered cubic boron nitride and sintered diamond.

14. A coated cutting insert for use in a chipforming material removal operation, the cutting insert comprising:
   a substrate and a wear-resistant coating scheme wherein the wear-resistant coating scheme comprising:
   a mediate multi-periodicity nanolayer coating scheme containing titanium, aluminum, chromium and X;
   the mediate multi-periodicity nanolayer coating scheme comprising a plurality of sets of alternating layer arrangements wherein each one of the alternating layer arrangements comprises a base layer comprising titanium, aluminum and X and a nanolayer region comprising a plurality of sets of alternating nanolayers wherein each set of alternating nanolayers comprises one nanolayer comprising aluminum, chromium, titanium and X and another nanolayer comprising aluminum, chromium, titanium and X;
   wherein X comprising any one of the following nitrogen, carbon, boron, carbon and nitrogen, boron and nitrogen, carbon and boron and nitrogen, nitrogen and oxygen, carbon and oxygen, boron and oxygen, carbon and nitrogen and oxygen, boron and nitrogen and oxygen, and carbon and boron and nitrogen and oxygen; and
   the base layer having a base layer thickness and the nanolayer region having a nanolayer region thickness wherein the base layer thickness is smaller than the nanolayer region thickness.

15. The coated cutting insert according to claim 14 wherein the wear-resistant coating scheme further including:
   an underlayer containing aluminum, chromium and X;
   a top layer containing aluminum, chromium and X, and wherein the underlayer being closer to the substrate than the top layer;
   a lower transition coating region comprising a plurality of sets of alternating lower transition nanolayers wherein each set of alternating lower transition nanolayers comprises one lower transition nanolayer comprising aluminum, chromium, titanium and X and another lower transition nanolayer comprising aluminum, chromium, titanium and X, and the lower transition coating region providing a transition between the mediate multi-periodicity nanolayer coating scheme and the underlayer;
   an upper transition coating region comprising a plurality of sets of alternating upper transition nanolayers wherein each set of alternating upper transition nanolayers comprises one upper transition nanolayer comprising aluminum, chromium, titanium and X and another upper transition nanolayer comprising aluminum, chromium, titanium and X, and the upper transition coating region providing a transition between the mediate multi-periodicity nanolayer coating scheme and the top layer; and
   the mediate multi-periodicity nanolayer coating scheme being mediate of the lower transition coating region and the upper transition coating region.

16. A method of applying a coating scheme comprising the steps of:
   applying a mediate multi-periodicity nanolayer coating scheme containing titanium, aluminum, chromium and X, and the step of applying the mediate multi-periodicity nanolayer coating scheme comprising the steps of:
   applying a plurality of sets of alternating layer arrangements wherein application of each alternating layer arrangement comprising the steps of:
      applying a base layer comprising titanium, aluminum and X; and
      applying a nanolayer region comprising the steps of:
         applying a plurality of sets of alternating nanolayers comprising the steps of:
            applying one nanolayer comprising titanium, aluminum chromium, and X, and
            applying another nanolayer comprising aluminum, chromium, titanium and X.

17. The method of applying a coating scheme according to claim 16 further comprising the steps of:

providing a cutting insert substrate;
prior to applying the mediate multi-periodicity nanolayer coating scheme, applying, so as to be closest to the substrate, an underlayer containing aluminum, chromium and X;
the step of applying a mediate multi-periodicity nanolayer coating scheme further including applying the mediate multi-periodicity nanolayer coating scheme to the underlayer; and
applying a top layer to the mediate multi-periodicity nanolayer coating scheme wherein the top layer containing aluminum, chromium and X.

18. The method of applying a coating scheme according of claim 17 further including the steps of:
after applying the underlayer and prior to applying the mediate multi-periodicity nanolayer coating scheme, applying a lower transition layer comprising a plurality of sets of alternating lower transition nanolayers comprising the steps of:
applying a plurality of sets of alternating lower transition nanolayers comprising the steps of:
applying one lower transition nanolayer comprising titanium, aluminum chromium, and X, and
applying another lower transition nanolayer comprising aluminum, chromium, titanium and X;
after applying the mediate multi-periodicity nanolayer coating scheme, applying an upper transition layer comprising a plurality of sets of alternating upper transition nanolayers comprising the steps of:
applying a plurality of sets of alternating upper transition nanolayers comprising the steps of:
applying one upper transition nanolayer comprising titanium, aluminum chromium, and X, and
applying another upper transition nanolayer comprising aluminum, chromium, titanium and X.

19. The method of applying a coating scheme according to claim 18 wherein X comprises any one of the following: nitrogen, carbon, boron, carbon and nitrogen, boron and nitrogen, carbon and boron and nitrogen, nitrogen and oxygen, carbon and oxygen, boron and oxygen, carbon and nitrogen and oxygen, boron and nitrogen and oxygen, and carbon and boron and nitrogen and oxygen.

20. A coated article comprising:
a substrate and a wear-resistant coating scheme wherein the wear-resistant coating scheme comprising:
a mediate multi-periodicity nanolayer coating scheme containing titanium, aluminum, chromium and nitrogen; and
the mediate multi-periodicity nanolayer coating scheme comprising a plurality of sets of alternating layer arrangements wherein each one of the alternating layer arrangements comprises a base layer comprising titanium, aluminum and nitrogen and a nanolayer region comprising a plurality of sets of alternating nanolayers wherein each set of alternating nanolayers comprises one nanolayer comprising aluminum, chromium, titanium and nitrogen and another nanolayer comprising aluminum, chromium, titanium and nitrogen, and the base layer having a base layer thickness and the nanolayer region having a nanolayer region thickness wherein the base layer thickness is smaller than the nanolayer region thickness.

21. The coated article according to claim 20 wherein the base layer comprising $(Ti_yAl_{1-y})N$ wherein $0.2 \leq y \leq 0.65$; and the one nanolayer of the set of alternating nanolayers in the nanolayer region comprising $(Ti_yCr_xAl_{1-(x+y)})N$ wherein $0 < x \leq 0.15$ and $0.2 \leq y \leq 0.65$, and other nanolayer of the set of alternating nanolayers in the nanolayer region comprising $(Ti_pAl_qCr_{1-(p+q)})N$ wherein $0.2 \leq p \leq 0.65$ and $0.01 \leq q \leq 0.65$ and $(p+q) < 1$.

22. The coated article according to claim 20 wherein the substrate comprising one of the following: high speed steel, cemented carbides including cobalt-tungsten carbide, ceramics including SiAlON and alumina and silicon nitride, cermets, and superhard materials including sintered cubic boron nitride and sintered diamond.

* * * * *